(12) United States Patent
Noguchi

(10) Patent No.: US 6,218,893 B1
(45) Date of Patent: Apr. 17, 2001

(54) POWER CIRCUIT AND CLOCK SIGNAL DETECTION CIRCUIT

(75) Inventor: Hidekazu Noguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/167,670

(22) Filed: Oct. 7, 1998

(30) Foreign Application Priority Data

Feb. 19, 1998 (JP) .................................................. 10-055974

(51) Int. Cl.[7] .................................................... G05F 3/02
(52) U.S. Cl. ............................................. 327/540; 327/544
(58) Field of Search ................................. 327/72, 73, 77, 327/78, 79, 80, 81, 87, 88, 89, 543, 540, 544; 365/189.09, 226, 227

(56) References Cited

U.S. PATENT DOCUMENTS 5,189,316 * 2/1993 Murakami et al. ................... 307/296
5,448,199 * 9/1995 Park ..................................... 327/546
5,581,206 * 12/1996 Chevalier et al. ................... 327/143

* cited by examiner

Primary Examiner—Toan Tran
Assistant Examiner—Linh Nguyen
(74) Attorney, Agent, or Firm—Jones Volentine, L.L.C.

(57) ABSTRACT

A power circuit includes an internal voltage regulation portion, a response time regulation portion, p-channel type field-effect transistors (FET) which serve as a voltage transformation portion, and a clock signal detection circuit. An external voltage input to the power circuit is transformed into an internal voltage which is set by a reference voltage, and the variance of the internal voltage may be compensated by the internal voltage regulation portion. Also, the response speed of the internal voltage regulation portion to the variance of the internal voltage may be regulated by the response time regulation portion. The clock signal detection portion detects a clock signal and switches an n-channel type FET in the response time regulation portion to an active state, thereby enhancing the response speed of the internal voltage regulation portion. Accordingly, the power circuit ensures stabilized output of power and effective power saving as well.

13 Claims, 5 Drawing Sheets

POWER CIRCUIT AND CLOCK SIGNAL DETECTION CIRCUIT

BACKGROUND OF THE INVENTION

1. Field of the Invention

This invention relates to a power circuit and a clock signal detection circuit, and especially relates to those which are applicable to a semiconductor memory device.

2. Description of the Related Art

With the recent remarkable advancement in the microminiaturization technique of the semiconductor memory device provided with an extremely large memory capacity, a new problem has come out that the dielectric strength or the withstand voltage of the memory device is more weakened or lowered. In order to manage this problem, the semiconductor memory device such as a synchronous DRAM it (SDRAM) which synchronously operates with the clock signal, is provided with a power circuit which serves to reduce an externally supplied voltage such as 3.3 V to a voltage 2.7 V for use in the memory device.

In the operation of the memory device, as is known, there is a situation in which after receiving the input of an active command, SDRAM is kept in a waiting position i.e. in an active standby mode, for a certain period of time until the next command such as data read or write command is inputted thereto. In order to save the power consumption in such a situation, some measures have been taken so far, for instance interrupting the supply of the clock signal to SDRAM, or invalidating the clock signal by the clock enable signal to stop all the circuits operable with the clock signal.

The power consumption by SDRAM is also increased while SDRAM is in operation for reading/writing data, and this causes the internal voltage to be varied. In order to manage this internal voltage variance, the prior art power circuit which is built in SDRAM is constituted to monitor the internal voltage variance and to immediately compensate it, if any, so as to maintain the constant and stable power supply to the circuit connected with SDRAM.

However, in order that the built-in power circuit may quickly respond to the internal voltage variance, it is needed that the built-in power circuit is additionally provided with another circuit such as an amplifier circuit for amplifying the output power thereof, thereby increasing the internal current in the circuits constituting the power circuit. Consequently, this results in increase in the internal current totally spent by the whole built-in power circuit including the added amplifier circuit. Thus, this raises the power consumption by the entire SDRAM, which is against the purpose of saving the power after all.

Furthermore, while SDRAM stays in the active standby mode, it does not carry out any operation for reading/writing data. In spite of this, the prior art built-in power circuit has to keep the internal current at an increased level, because the built-in power circuit has to quickly respond at any time to the possible internal voltage variance which might be caused by the coming operation of reading/writing data. Consequently, SDRAM has to unnecessarily waste the power whenever it is in the active standby mode.

SUMMARY OF THE INVENTION

Accordingly, the invention has been made in view of the problems experienced in the prior art built-in power circuit as described in the above, and a object of the invention is to provide an power circuit which makes it possible to output the constant and stable power, and at the same time to achieve the effective power saving.

Furthermore, the second object of the invention is to provide a clock signal detection circuit which detects the clock signal and supplies the detected signal to the power circuit which is built in the semiconductor memory such as SDRAM, thereby judging if SDRAM is in the active standby mode or not.

In order to solve the problems as mentioned above, according to the first aspect of the invention, there is provided a power circuit which is provided in the semiconductor memory and transforms the external voltage applied to the semiconductor memory into a predetermined internal voltage. This power circuit includes a voltage transformation portion for transforming the external voltage into the internal voltage; an internal voltage regulation portion which monitors the value of the internal voltage and outputs a control signal, which controls the voltage transformation in response to the variance of the internal voltage, to the voltage transformation portion; and a response time regulation portion which regulates the output response time of the above voltage transformation control signal based on the mode signal corresponding to a plurality of operational modes of the semiconductor memory. According to the constitution of the power circuit as mentioned above, the response speed of the internal voltage regulation portion can be set in response to the variance of the internal voltage, based on the operational mode of the semiconductor memory. More specifically, if the semiconductor memory operates in the data write/read mode which tends to increase the variance of the internal voltage, the varied internal voltage can be instantaneously returned to its predetermined value by increasing the response speed of the internal voltage regulation portion. Contrary to this, if the semiconductor memory operates in the mode which hardly causes the variance of the internal voltage, it is possible to decrease the response speed of the internal voltage regulation portion.

Since the output response time of the response time regulation portion can be regulated by means of controlling the value of the internal current in the internal voltage regulation portion, the internal current of the power circuit is optimized in correspondence with the operational mode of the semiconductor memory. Consequently, there is achieved the reduction of the power consumption by the semiconductor memory.

Since the internal voltage regulation portion monitors the value of the internal voltage referring to the value of a reference voltage, the value of the internal voltage can be altered with ease by regulating the reference voltage.

If a plurality of operational modes of the semiconductor memory includes at least an active standby mode, the power consumption of the power circuit can be reduced by lowering the response speed of the internal voltage regulation portion during the active standby mode.

The above-mentioned power circuit may be provided with a clock signal detection circuit which detects a clock signal in the semiconductor memory and is able to output the detection result thereof as the active standby mode signal. With this, the operational mode, especially the standby mode of the semiconductor memory can be discriminated with ease by detecting the clock signal.

The clock signal detection circuit may include a charge/discharge circuit which charges the output node thereof, synchronized with the rising edge and the falling edge of the clock signal, and if the discharge time of the output node of the charge/discharge circuit is set longer compared with the period of said clock signal, the clock signal detection circuit ensures the clock signal detection with the simple circuit structure.

The clock signal detection circuit may be provided with a first one-shot pulse generating circuit which generates a one-shot pulse, synchronized with the rising edge of the clock signal, and a second one-shot pulse generating circuit which generates a one-shot pulse, synchronized with the falling edge of the clock signal. The operation of the charge/discharge circuit can be stabilized with provision of these one-shot pulse generating circuits.

The clock signal detection circuit may be constructed to include a first charge/discharge circuit which charges the output node thereof, synchronized with the falling edge of the clock signal, and starts discharging the same, synchronized with the rising edge of the clock signal; a second charge/discharge circuit which charges the output node thereof, synchronized with the rising edge of said clock signal, and starts discharging the same, synchronized with the falling edge of said clock signal; and an exclusive NOR gate, of which the first input terminal is connected with the output node of the first charge/discharge circuit while the second input terminal thereof is connected with the output node of the second charge/discharge circuit. If the discharge time of each output node of the above first and second charge/discharge circuits is set longer compared with the period of said clock signal, the clock signal can be surely detected with a smaller circuit scale.

According to the second aspect of the invention, there is provided in order to solve the problems as mentioned above, another clock signal detection circuit which detects the clock signal and outputs the signal as detected. This clock signal detection circuit is provided with a charge/discharge circuit which charges its output node, synchronized with the rising edge and the falling edge of said clock signal. The structure of this clock signal detection circuit enables the clock signal to be detected with a smaller circuit scale. Furthermore, more sure clock signal detection can be achieved by setting the discharge time of the output node of the charge/discharge circuit so as to be longer than the period of the clock signal.

The above clock signal detection circuit may be provided with a first one-shot pulse generating circuit which generates a one-shot pulse, synchronized with the rising edge of the clock signal; and a second one-shot pulse generating circuit which generates a one-shot pulse, synchronized with the falling edge of the clock signal. With this, the operation of the charge/discharge circuit can be stabilized with provision of these one-shot pulse generating circuits.

Furthermore, the clock signal detection circuit may be constructed to include a first charge/discharge circuit which charges the output node thereof, synchronized with the falling edge of the clock signal, and starts discharging the same, synchronized with the rising edge of the clock signal; a second charge/discharge circuit which charges the output node thereof, synchronized with the rising edge of the clock signal, and starts discharging the same, synchronized with the falling edge of the clock signal; and an exclusive NOR gate, of which the first input terminal is connected with the output node of the first charge/discharge circuit, and of which the second input terminal is connected with the output node of the second charge/discharge circuit. Furthermore, more sure clock signal detection can be achieved by setting the discharge time of each output node of the first and second charge/discharge circuit to be longer than the period of the clock signal with a smaller circuit scale.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENT

Figure 1:
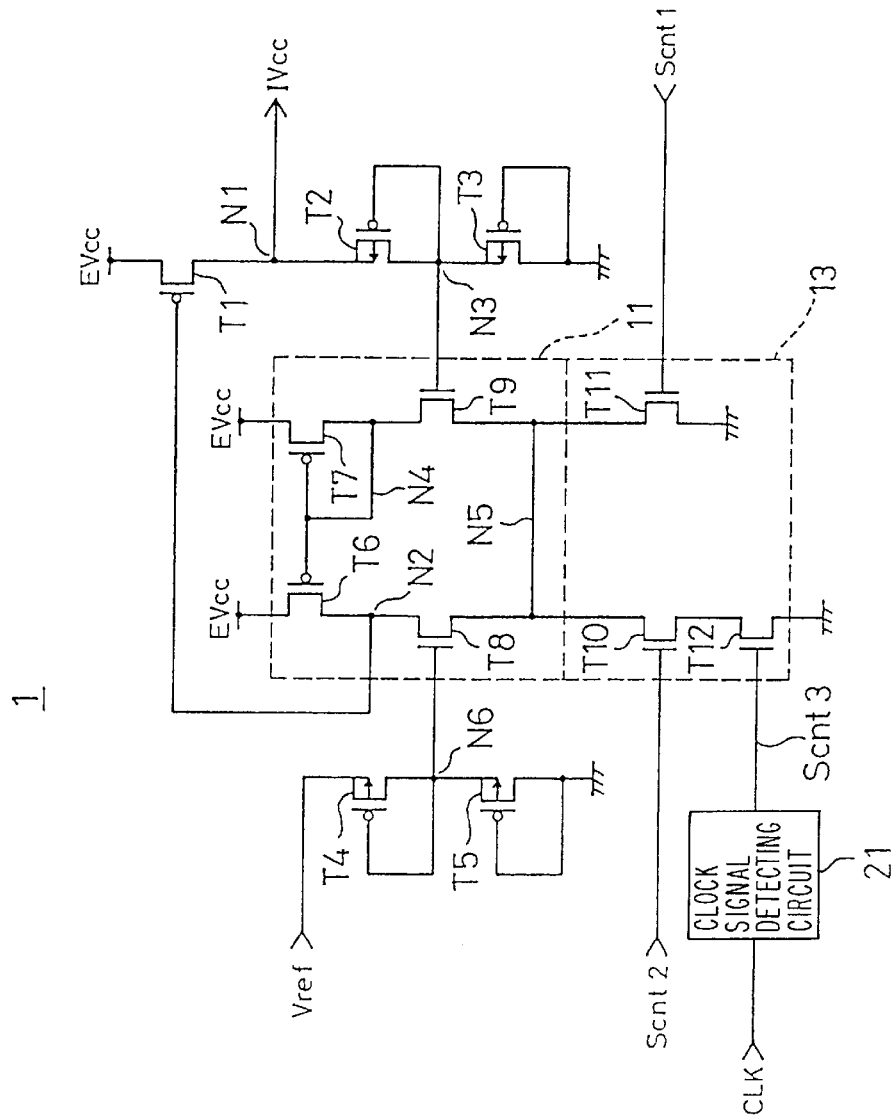
FIG. 1 is a circuit diagram of a power circuit according to an embodiment of the invention.

Preferred embodiments of the power circuit and the clock signal detection circuit according to the invention will now be explained in detail in the following with reference to accompanying drawings. In order to avoid unnecessary iteration in the following description, the constituents of the invention having almost same function and constitution are designated by identical reference numerals and symbols.

Referring to FIG. 1, a power circuit 1 includes an internal voltage regulation portion 11, a response time regulation portion 13, p-channel type field-effect transistors (referred to as FET or FETs hereinafter) T1, T2, T3, T4, and T5 which serve as the voltage transformation portion, and a clock signal detection circuit 21. The internal voltage regulation portion 11 includes p-channel type FETs T6 and T7, and n-channel type FETs T8 and T9. The response time regulation portion 13 includes n-channel type FETs T10, T11, and T12.

The above constituents of the power circuit 1 are connected with one another as follows. The source of the p-channel type FET T1 is connected with an external voltage EVcc while the drain of the same is connected with the source of p-channel FET T2, thereby forming a node N1 from which an internal voltage IVcc is outputted. The gate of the p-channel type FET T1 is connected with the juncture between the drain of the p-channel FET T6 and the drain of n-channel FET T8, thereby forming a node N2.

The gate and drain of the p-channel type FET T2, the source of the p-channel type FET T3, and the gate of the n-channel type FET T9 are connected together, thereby forming a node N3. The gate and drain of p-channel type FET T3 are equally grounded.

Each source of p-channel type FETs T6 and T7 is connected with the external voltage EVcc while each gate of them is connected with a node N4, which is further connected with the drain of the p-channel type FET T7 and the drain of the n-channel type FET T9 as well. Each source of n-channel type FETs T8 and T9 is connected with each drain of n-channel type FETs T10 and T11 via a node N5.

The source of the n-channel type FET T10 is connected with the drain of the n-channel type FET T12, and each source of n-channel type FETs T11 and T12 is respectively grounded.

The first control signal Scnt1 is always supplied to the gate of the n-channel type FET T11 while the second control signal Scnt2 is supplied to the gate of the n-channel type FET T10 at a predetermined timing. The first control signal Scnt1 is regulated to serve as a threshold voltage to the n-channel type FET T11.

The gate of the n-channel type FET T8 is connected with a node N6 which is further connected with the drain and gate of the p-channel type FET T4 and also with the source of the p-channel type FET T5. Both of the gate and drain of the p-channel FET T5 are equally grounded. A reference voltage Vref is inputted to the source of the p-channel type FET T4. This reference voltage Vref is used for setting the value of the internal voltage IVcc.

The gate of the n-channel type FET T12 is connected with a clock signal detection circuit 21 embodying the invention and is supplied with the third control signal Scnt3. A clock signal CLK is inputted to the clock signal detection circuit 21.

Figure 2:
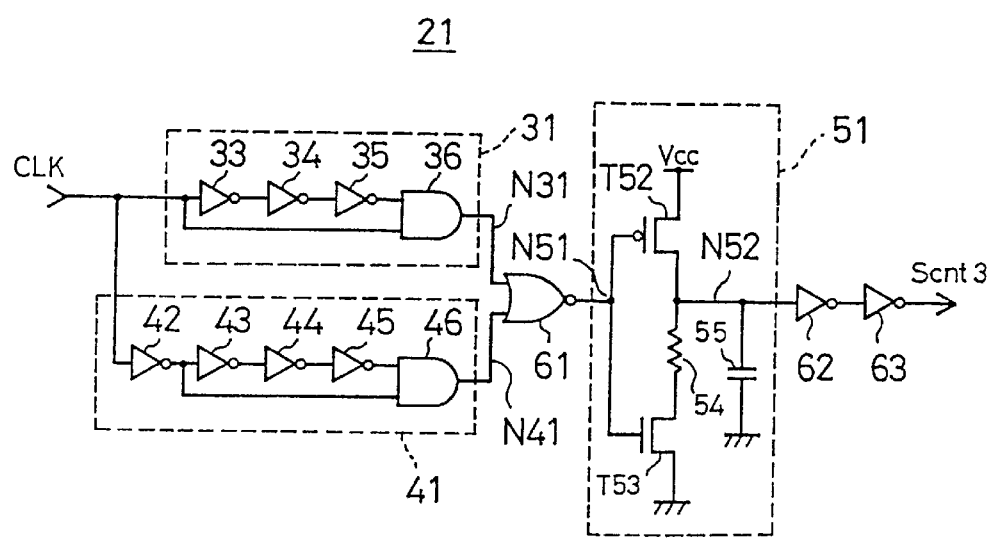
FIG. 2 is a circuit diagram of a clock signal detection circuit according to an embodiment of the invention.

The structure of the clock signal detection circuit 21 will now be described in the following with reference to FIG. 2. The clock signal detection circuit 21 includes a first one-shot pulse generating circuit 31, a second one-shot pulse generating circuit 41, a charge/discharge circuit 51, a NOR gate 61, and two inverter gates 62 and 63.

The first one-shot pulse generating circuit 31 is provided with three inverter gates 33, 34, 35, and an AND gate 36. The second one-shot pulse generating circuit 41 is provided with four inverter gates 42, 43, 44, 45, and an AND gate 46.

The charge/discharge circuit 51 is provided with a p-channel type FET T52, a n-channel type FET T53, a resistive element 54, and a capacitive element 55.

The external clock signal CLK to this clock signal detection circuit 21 is respectively inputted to the input terminal of the inverter gate 33, one input terminal of the AND gate 36, and the input terminal of the inverter gate 42. The output terminal of the inverter gate 33 is connected with the input terminal of the inverter gate 34, of which the output terminal is further connected with the input terminal of the inverter gate 35, and finally, the output terminal of the inverter gate 35 is connected with the other input terminal of the AND gate 36. On the other hand, the output terminal of the inverter gate 42 is connected with the input terminal of the inverter gate 43 and also with one input terminal of the AND gate 46. The output terminal of the inverter gate 43 is connected with the input terminal of the inverter gate 44, of which the output terminal is connected with the input terminal of the inverter gate 45. Finally, the output terminal of the inverter gate 45 is connected with the other input terminal of the AND gate 46.

The output terminal of the AND gate 36 is connected with one input terminal of a NOR gate 61 via a node N31 while the output terminal of the AND gate 46 is connected with the other input terminal of a NOR gate 61 via a node N41.

The output terminal of the NOR gate 61 is connected with the gate of the p-channel type FET T52 and also with the gate of the n-channel type FET T53 via a node N51. The source of the p-channel type FET T52 is connected with a power source Vcc while the drain of the same is connected with the node N52. The source of the n-channel type FET T53 is grounded while the drain of the same is connected with one end of the resistive element 54, which connects its other end with the node N52. Furthermore, this node N52 is connected with one end of the capacitive element 55 and also with the input terminal of an inverter gate 62. The other end of the capacitive element 55 is grounded.

The output terminal of the inverter gate 62 is connected with the input terminal of the inverter gate 63, from the output terminal of which the third control signal Scnt3 is outputted to control the n-channel type FET T12 provided in the response time regulation portion 13.

Operation of the power circuit 1 and the clock signal detection circuit 21 as constructed according to the invention will now be described in the following. The external voltage EVcc is externally supplied to the semiconductor memory such as SDRAM having the built-in power circuit 1, and its value is generally defined in the range of 3.3 volt through 5.0 volt. As compared with this, the value of the internal voltage IVcc outputted from the power circuit 1 is set such that it coincides with the reference voltage Vref, so that if the reference voltage Vref is 2.7 V, the internal voltage IVcc is set to the value of about 2.7 V.

Now, let us consider the case where neither row address strobe signal (RAS) nor column address strobe signal (CAS) is inputted to the semiconductor memory such as SDRAM which includes the built-in power circuit 1 and stores the data in its memory cell. In this case, it is enough for the power circuit I to output only the voltage necessary for holding the data in the memory cell, which will not cause the internal voltage to be significantly changed. Accordingly, if the n-channel type FET T10 of the response time regulation portion 13 is placed in its OFF-state by making the second control signal Scnt2 take a low level, almost all the internal current of the internal voltage regulation portion 11 will flow through the n-channel FET T11. At this stage, as mentioned in the above, the first control signal Scnt1 is defined so as to coincide with the threshold voltage of the n-channel type FET T11, so that the internal current of the power circuit 1 is limited by the n-channel type FET T11. Consequently, it becomes possible to reduce the power consumption of the semiconductor memory provided with the power circuit 1 as built therein.

Next, let us consider the case where SDRAM performs various operation such as operation of writing or reading data. To be of course, in this case, SDRAM has to spend a predetermined power. Accordingly, the power circuit 1 has to turn on the n-channel type FETs T10 and T12 to increase the internal current of the internal voltage regulation portion 11 and has to stably output the internal voltage IVcc necessary for the SDRAM operation. Accordingly, the second control signal Scnt2 of a high level is inputted to the power circuit 1 in order to turn on the n-channel type FET T10. Furthermore, it is needed for SDRAM to operate so as to be synchronized with the clock signal CLK, so that the clock signal detection circuit 21 detects the clock signal CLK when it is inputted to SDRAM.

Figure 3:
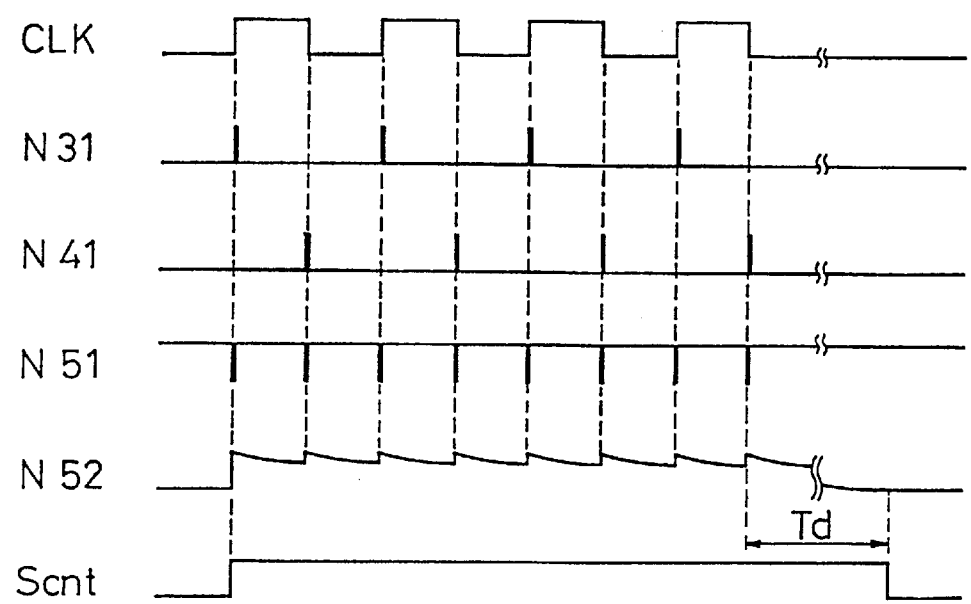
FIG. 3 is a timing chart for explaining the operation of the clock signal detection circuit as indicated in FIG. 2.

Now, referring to the timing chart as shown in FIG. 3, when the clock signal CLK is inputted to the clock signal detection circuit 21, the first one-shot pulse generating circuit 31 outputs, to the node N31, a pulse signal synchronized with the rising edge of the inputted clock pulse signal CLK. At the same time, the second one-shot pulse generating circuit 41 also outputs, to the node N41, a pulse signal synchronized with the falling edge of the inputted clock pulse signal CLK. Then, the NOR gate 61 outputs, to the node N51, a low active pulse signal synchronized with both signals from the nodes N31 and N41. Furthermore, the charge/discharge circuit 51 outputs, to the node N52, a saw-tooth pulse which is synchronized with the pulse from the node N51 and has a sharply rising edge. In this case, the fall time Td of the saw-tooth pulse outputted by the charge/discharge circuit 51 can be determined depending on the values of the resistive element 54 and the capacitive element 55, so that if the fall time Td is set to be adequately longer, for instance 100 ns, compared with the period of the clock signal CLK, the voltage at the node N52 will be able to have a sufficient value enabling inverter gates 62 and 63 to be in their active state, while the clock signal CLK is being inputted to SDRAM.

As mentioned above, when the clock signal detection circuit 21 detects the clock signal CLK, it comes to output the third control signal Scnt3 of a high level to the n-channel type FET T12. When SDRAM carries out various operations such as data writing or reading operations, the n-channel type FET T12 is turned on together with the n-channel type FET T11 as mentioned above, thus the value of the internal current of the internal voltage regulation portion 11 in the power circuit 1 is increased.

Next, there will be described the operation of the power circuit 1 when SDRAM starts its operation and a circuit which is connected with the power circuit 1 to be supplied with the internal voltage IVcc, abruptly increases its power consumption. The internal voltage IVcc is generated by dropping the external voltage EVcc through the p-channel type FET T1. When the current from the node N1 to the circuit connected with the power circuit 1 is increased instantaneously, the voltage at the node N1 tends to go down in respect to the predetermined internal voltage IVcc. The voltage drop at the node N1 like this is reflected in the node N3 which is the juncture between the p-channel type FET T2 and the p-channel type FET T3. In the present embodiment, however, it is assumed that the voltage at the node N3 is set as about a half of the voltage at node N1.

The internal voltage regulation portion 11 has a structure as a so-called current-mirror circuit and has the function of regulating the voltage at the node N2 in view of the result of comparison between the voltage at the node N3 and the voltage at the node N6 i.e. a half of the reference voltage Vref. Thus, when the voltage at the node N3 tends to go down as mentioned above, the voltage at the node N2 correspondingly tends to go down, so that the p-channel type FET T1 comes to indicate the more intensified ON-state. Therefore, the voltage drop at the node N1 is compensated so that the internal voltage IVcc outputted therefrom is able to always maintain the predetermined stable value thereof. The time needed for the internal voltage IVcc to return to its predetermined voltage value depends on the value of the internal current of the internal voltage regulation portion 11. Accordingly, in case of the abrupt increase of power consumption being expected, for instance during SDRAM operation for data writing/reading as described above, the n-channel type transistor T10 and T12 are turned on to increase the value of the internal current of the internal voltage regulation portion 11, thereby shortening the time for the internal voltage IVcc to return to its predetermined value in order to always keep the internal voltage IVcc at a constant value.

In general, in case of writing the data in SDRAM at a predetermined interval, the clock signal CLK is made not to be inputted to SDRAM, or made invalid within SDRAM by using an clock enable signal (not shown) during such interval. This is because SDRAM has nothing to do during the interval, thus no clock signal CLK being needed, and also because the power consumption by SDRAM can be lowered by nullifying the clock signal CLK.

In case of the clock signal CLK being made invalid inside SDRAM, there is no need for the clock signal detection circuit 21 according to the invention to detect any clock signal CLK. Accordingly, as shown by the timing chart in FIG. 3, the third control signal Scnt3 takes the low level, thus the n-channel type FET T12 is placed in the OFF state. While SDRAM is placed in the active standby state, more specifically, it is waiting for various operational commands such as data writing command, the n-channel type FET T10 is placed in the ON state by the second control signal Scnt2. However, as the n-channel type FET T12 is in the OFF state, the internal current of the internal voltage regulation portion 11 in the power circuit 1 according to the invention comes to flow through the n-channel type FET T11. Namely, based on the information from the clock signal detection circuit 21, the power circuit I judges that SDRAM is in the active standby state, and reduces the internal current of the internal voltage regulation portion 11, so that the power consumption by the power circuit 1 is effectively decreased. In case of the operational command such as a data writing command being inputted to SDRAM, the clock signal CLK is made active within SDRAM prior to actual execution of the data writing operation, so that the internal current value of the internal voltage regulation portion 11 in the power circuit 1 is already increased at the actual execution of the data writing operation. Accordingly, the response speed of the internal voltage regulation portion 11 can be regulated so as to well follow the internal voltage IVcc, even if the voltage IVcc varies largely.

Figure 4:
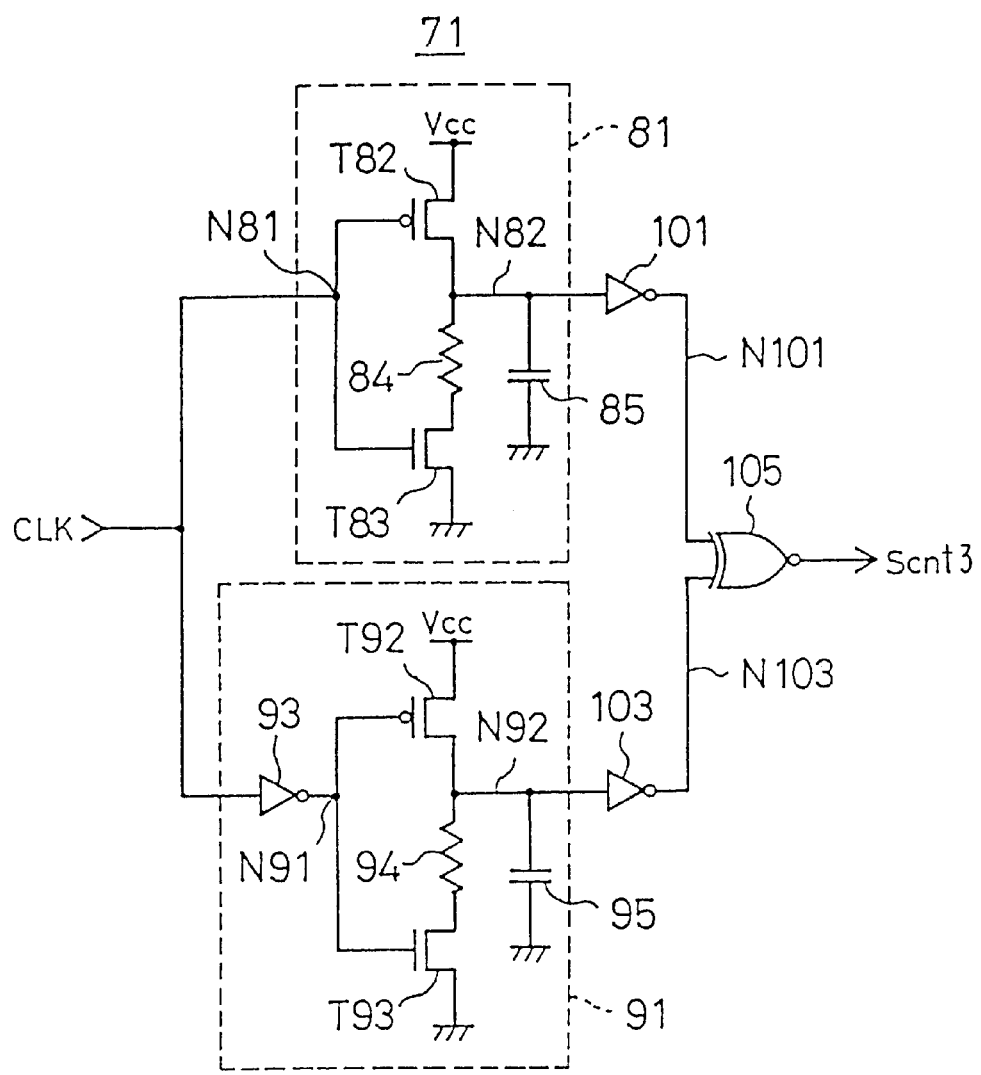
FIG. 4 is a circuit diagram of another clock signal detection circuit according to another embodiment of the invention.

The clock signal detection circuit 21 may be replaced by another clock signal detection circuit 71 shown in FIG. 4, which will be described in the following.

The clock signal detection circuit 71 includes a first charge/discharge circuit 81, a second charge/discharge circuit 91, two inverter gate 101 and 103, and an exclusive NOR (ExNOR) gate 105. The first charge/discharge circuit 81 further includes a p-channel type FET T82, a n-channel type FET T83, a resistive element 84, and a capacitive element 85. On the other hand, the second charge/discharge circuit 91 further includes a p-channel type FET T92, a n-channel type FET T93, an inverter gate 93, a resistive element 94, and a capacitive element 95.

A clock signal CLK externally coming to the clock signal detection circuit 71 is inputted to the node N81 of the first charge/discharge circuit 81 and also to the input terminal of the inverter gate 93 of the second charge/discharge circuit 91.

The node N81 is connected with each gate of the p-channel type FET T82 and the n-channel type FET T83. The source and drain of the p-channel type FET T82 are connected with a power source Vcc and a node N82, respectively. The source of the n-channel type FET T83 is grounded while its drain is connected with one end of the resistive element 84, of which the other end is connected with the node N82. This node N82 is also connected with one end of the capacitive element 85 and the input terminal of an inverter gate 101. The other end of the capacitive element 85 is grounded.

On one hand, the output terminal of the inverter gate 93 of the charge/discharge circuit 91 is connected with each gate of the p-channel type FET T92 and the n-channel type FET T93. The source and drain of the p-channel type FET T92 are connected with a power source Vcc and a node N92, respectively. The source of the n-channel type FET T93 is grounded while its drain is connected with one end of the resistive element 94, of which the other end is connected with the node N92. This node N92 is also connected with one end of the capacitive element 95 and the input terminal of an inverter gate 103. The other end of the capacitive element 95 is grounded.

Furthermore, the output terminal of the inverter gate 101 is connected with one input terminal of the ExNOR gate 105 while the output terminal of the inverter gate 103 is connected with the other input terminal of the ExNOR gate 105, from the output terminal of which the third control signal Scnt3 is outputted to control the n-channel type FET T12 provided in the response time regulation portion 13.

When the clock signal CLK is inputted to the clock signal detection circuit 71, as indicated by the timing chart in FIG.

5, the first charge/discharge circuit 81 outputs, to the node N82, such a signal that sharply rises synchronized with the falling edge of the clock signal CLK and gently falls synchronized with the rising edge of the clock signal CLK. On one hand, the second charge/discharge circuit 91 outputs, to the node N92, such a converse signal that it sharply rises synchronized with the rising edge of the clock signal CLK and gently falls synchronized with the falling edge of the clock signal CLK.

Figure 5:
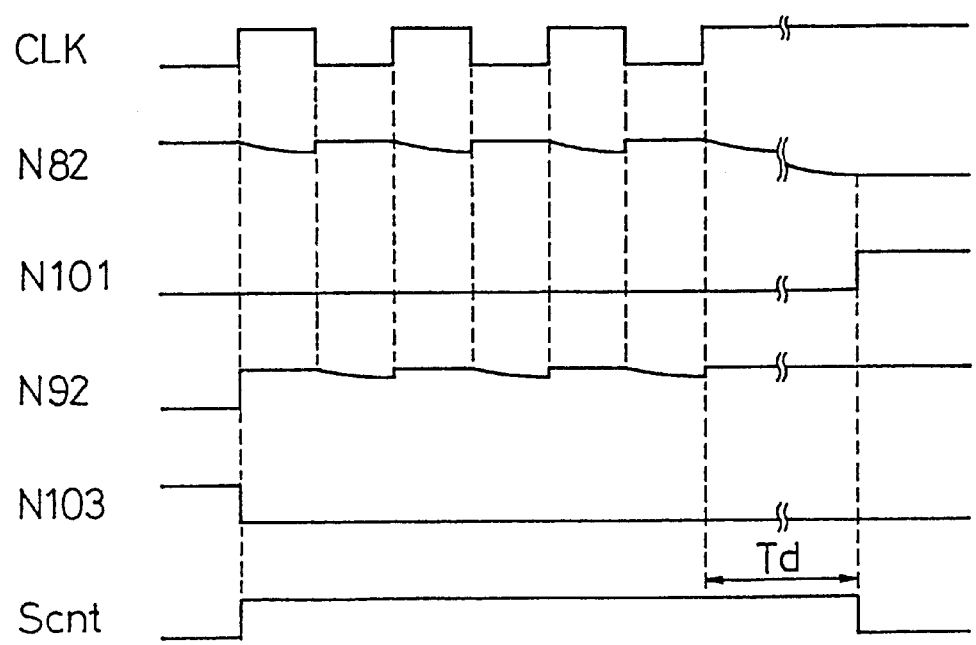
FIG. 5 is a timing chart for explaining the operation of the clock signal detection circuit as indicated in FIG. 4.

The signal from the node N82 is inputted to one input terminal of ExNOR gate 105 via the inverter gate 101 while the signal from the node N92 is inputted to the other input terminal of ExNOR gate 105 via the inverter gate 103. Now, according to the clock signal detection circuit 71 as constructed above, the fall time Td of the signal outputted by the first charge/discharge circuit 81 can be set based on the value of the resistive element 84 and the value of the capacitive element 85. Similarly, the fall time Td of the signal from the second charge/discharge circuit 91 can be also set based on the value of the resistive element 94 and the value of the capacitive element 95. Therefore, if the value of this falling time Td is set sufficiently longer, for instance 100 ns, comparing to the period of the clock signal CLK, the third control signal Scnt3 can be kept active while the clock signal CLK is inputted to SDRAM. Accordingly, as shown in FIGS. 3 and 5, the n-channel FET T12 provided in the response time regulation portion 13 can be controlled by the third control signal Scnt3 outputted by the clock signal detection circuit 71 at the almost same timing as controlled by the third control signal Scnt3 outputted by the clock signal detection circuit 21 as previously described.

As described above, the clock signal detection circuit 71 makes it possible to obtain the same effect as the clock signal detection circuit 21 achieves. Furthermore, the former can be constructed with less constituents than the latter, thus further saving of the power being realized.

Some preferred embodiments according to the invention have been described with reference to the accompanying drawings so far, but the invention should not be limited by these embodiments. It is apparent that any one skilled in the art may make various modification over the above embodiments within the category of the technical idea recited in the scope of claim for patent as attached hereto, and it should be understood that such modification naturally belongs to the technical scope of the invention.

For instance, in the above embodiments, the n-channel type FET T10 and the n-channel type FET T12 are connected in series in the response time regulation portion 13. However, this is not always the indispensable condition. It is possible to omit the n-channel type FET T12, and to directly control the n-channel type FET T10 by the clock signal detection circuit 21 or 71.

As has been discussed above, according to the first aspect of the invention, there is provided the power circuit in which the response speed of the internal voltage regulation portion for responding to the variance of the internal voltage can be set in correspondence with the operational mode of the semiconductor memory, thus the internal voltage being stabilized. Furthermore, the value of the internal current of the power circuit is optimized corresponding to the operational mode of the semiconductor memory, so that the power consumption of the semiconductor memory provided with the power circuit can be reduced.

Furthermore, according to the second aspect of the invention, there is provided the clock signal detection circuit which has a simple structure and ensures the detection of the clock signal. If such clock signal detection is applied to the semiconductor memory such as SDRAM, the operational mode of SDRAM, especially the active standby mode can be detected with ease.

The entire disclosure of Japanese Patent Application No. 10-55974 filed on Feb. 19, 1998 including specification, claims, drawings and summary is incorporated herein by reference in its entirety.

What is claimed is:

1. A power circuit which is provided in a synchronous dynamic random access memory device that operates synchronously with a clock signal input thereto, the power circuit comprising:

a voltage transformation portion that transforms an external voltage into an internal voltage, the internal voltage having a level lower than a level of the external voltage;

an internal voltage regulation portion that monitors the internal voltage and outputs to said voltage transformation portion a first control signal that controls the voltage transformation in response to the internal voltage;

a response time regulation portion that regulates output response time of the first control signal based on a second control signal; and a clock signal detection circuit that detects the clock signal and outputs the second control signal responsive thereto, said clock signal detection circuit including a charge/discharge circuit that charges an output node synchronized with a rising edge and a falling edge of the clock signal.

2. The power circuit as claimed in claim 1, wherein a discharge time of the output node of said charge/discharge circuit is set longer than a period of the clock signal.

3. The power circuit as claimed in claim 1, wherein said clock signal detection circuit comprises:

a first one-shot pulse generating circuit that generates a one-shot pulse synchronized with the rising edge of the clock signal; and a second one-shot pulse generating circuit that generates a one-shot pulse synchronized with the falling edge of the clock signal.

4. A power circuit which is provided in a synchronous dynamic random access memory device that operates synchronously with a clock signal input thereto, the power circuit comprising:

a voltage transformation portion that transforms an external voltage into an internal voltage, the internal voltage having a level lower than a level of the external voltage;

an internal voltage regulation portion that monitors the internal voltage and outputs to said voltage transformation portion a first control signal that controls the voltage transformation in response to the internal voltage;

a response time regulation portion that regulates output response time of the first control signal based on a second control signal; and a clock signal detection circuit that detects the clock signal and outputs the second control signal responsive thereto, said clock signal detection circuit including
a first charge/discharge circuit having a first output node, that charges the first output node synchronized with a falling edge of the clock signal and that starts discharging the first output node synchronized with a rising edge of the clock signal, a second charge/discharge circuit having a second output node, that charges the second output node synchronized with the rising edge of the clock[ ] signal and that starts discharging the second output node synchronized with the falling edge of the clock signal, and an exclusive NOR gate having a first input terminal connected to the first output node, a second input terminal connected to the second output node and an output terminal that provides the second control signal.

5. The power circuits as claimed in claim 4, wherein discharge times of said first and second charge/discharge circuits are set longer than a period of the clock signal.

6. A power circuit which is provided in a synchronous dynamic random access memory device that operates synchronously with a clock signal input thereto, the power circuit comprising:

a voltage transformation portion that transforms an external voltage into an internal voltage, the internal voltage having a level lower than a level of the external voltage;

an internal voltage regulation portion that monitors the internal voltage and outputs to said voltage transformation portion a first control signal that controls the voltage transformation in response to the internal voltage;

a response time regulation portion that regulates output response time of the first control signal based on a second control signal; and a clock signal detection circuit that detects the clock signal and outputs the second control signal responsive thereto, said response time regulation portion being operational in accordance with a plurality of operational modes of the synchronous dynamic random access memory device, including at least an active standby mode.

7. A power circuit which is provided in a synchronous dynamic random access memory device that operates synchronously with a clock signal input thereto, the power circuit comprising:

a voltage transformation portion that transforms an external voltage into an internal voltage, the internal voltage having a level lower than a level of the external voltage;

an internal voltage regulation portion that monitors the internal voltage and outputs to said voltage transformation portion a first control signal that controls the voltage transformation in response to the internal voltage;

a response time regulation portion that regulates output response time of the first control signal based on a second control signal; and a clock signal detection circuit that detects the clock signal and outputs the second control signal responsive thereto, the clock signal being input to the synchronous dynamic random access memory device, or being made valid within the synchronous dynamic random access memory device, when a data writing operation or a data reading operation is executed, and the clock signal not being input to the synchronous dynamic random access memory device, or being made invalid within the synchronous dynamic random access memory device, when the data writing operation or the data reading operation is not executed.

8. A power circuit which is provided in a synchronous dynamic random access memory device that operates synchronously with a clock signal input thereto, the power circuit comprising:

a voltage transformation portion that transforms an external voltage into an internal voltage, the internal voltage having a level lower than a level of the external voltage;

an internal voltage regulation portion that monitors the internal voltage and outputs to said voltage transformation portion a first control signal that controls the voltage transformation in response to the internal voltage;

a response time regulation portion that regulates output response time of the first control signal based on a second control signal; and a clock signal detection circuit that detects the clock signal and outputs the second control signal responsive thereto, the clock signal not being input to the synchronous dynamic random access memory device, or being made invalid within the synchronous dynamic random access memory device, during a first time period when the synchronous dynamic random access memory device receives an active command and does not receive a data read command or a data write command, and the clock signal being input to the synchronous dynamic random access memory device, or being made valid within the synchronous dynamic random access memory device, during a second time period just after the first time period when the synchronous dynamic random access memory device receives the data read command or the data write command.

9. A method of providing an operating voltage to a synchronous dynamic random access memory device that operates synchronously with a clock signal input thereto, comprising:

transforming an external voltage into an internal voltage for supply to the memory device as the operating voltage, the internal voltage having a level lower than a level of the external voltage;

monitoring the internal voltage and generating a first control signal responsive to the internal voltage that controls said transforming;

regulating an output response time of the first control signal based on a second control signal; and detecting the clock signal and generating the second control signal responsive thereto, said detecting comprising charging and discharging the second control signal as synchronized with a rising edge and a falling edge of the clock signal.

10. The method of providing an operating voltage of claim 9, wherein a discharge time of said charging and discharging is set longer than a period of the clock signal.

11. The method of providing an operating voltage of claim 9, wherein said charging and discharging comprises generating a one-shot pulse synchronized with the rising edge of the clock signal and generating a one-shot pulse synchronized with the falling edge of the clock signal.

12. A method of providing an operating voltage to a synchronous dynamic random access memory device that operates synchronously with a clock signal input thereto, comprising:

transforming an external voltage into an internal voltage for supply to the memory device as the operating voltage, the internal voltage having a level lower than a level of the external voltage;

monitoring the internal voltage and generating a first control signal responsive to the internal voltage that controls said transforming;

regulating an output response time of the first control signal based on a second control signal; and detecting the clock signal and generating the second control signal responsive thereto, said detecting including charging a first signal as synchronized with a falling edge of the clock signal, discharging of the first signal beginning as synchronized with a rising edge of the clock signal, charging a second signal as synchronized with the rising edge of the clock signal, discharging of the second signal beginning as synchronized with the falling edge of the clock signal, and performing a logical exclusive-NOR operation on the first and second signals to provide the second control signal.

13. The method of providing an operating voltage of claim 12, wherein discharge times of the first and second signals are set longer than a period of the clock signal.

* * * * *